United States Patent [19]

Olsen

[11] Patent Number: 4,553,104
[45] Date of Patent: Nov. 12, 1985

[54] METHOD OF COMPENSATING AN AMPLIFIER SYSTEM HAVING A VARIABLE GAIN AMPLIFIER TO ACHIEVE A CONSTANT OVERALL SYSTEM SIGNAL GAIN AND AN APPARATUS UTILIZING THE SAME

[75] Inventor: Arthur M. Olsen, Pennsburg, Pa.

[73] Assignee: Honeywell Inc., Minneapolis, Minn.

[21] Appl. No.: 585,048

[22] Filed: Mar. 1, 1984

[51] Int. Cl.⁴ ............................................... H03G 3/20
[52] U.S. Cl. .................................... 330/129; 330/279
[58] Field of Search ................. 330/86, 127, 129, 279; 367/66, 67

[56] References Cited

U.S. PATENT DOCUMENTS

| | | | |
|---|---|---|---|
| 3,525,948 | 8/1970 | Sherer et al. | 330/86 X |
| 3,813,609 | 5/1974 | Wilkes et al. | 330/124 R X |
| 4,016,557 | 4/1977 | Zitelli et al. | 330/86 X |
| 4,027,281 | 5/1977 | Greve et al. | 330/86 X |
| 4,194,163 | 3/1980 | Gillespie | 330/279 X |
| 4,279,510 | 7/1981 | Brown | 330/129 X |
| 4,349,883 | 9/1982 | Doljack | 330/86 X |
| 4,393,369 | 7/1983 | Davies | 367/67 X |
| 4,494,551 | 1/1985 | Little et al. | 330/85 X |

FOREIGN PATENT DOCUMENTS 2117585 10/1983 United Kingdom ................ 330/129

OTHER PUBLICATIONS

Jeffery, "Software-Controlled PGIA for Analog Signals Eliminates Manual Gain Adjustments", *Electronic Design*, vol. 29, No. 4, Feb. 19, 1981, pp. 190–192.

McKeon, "Amplifier Gain Selection with Noise Tolerance", *IBM Technical Disclosure Bulletin*, vol. 10, No. 5, Oct. 1967, p. 563.

*Primary Examiner*—James B. Mullins
*Attorney, Agent, or Firm*—Mitchell J. Halista; Trevor B. Joike

[57] ABSTRACT

A variable gain amplifier is adjusted to maintain its amplification within a linear range, i.e., to prevent saturation of the amplifier, by utilizing the output of an analog-to-digital converter, which is arranged to convert an analog output of the amplifier to a digital representation, by a digital computer to effect the gain change of the amplifier. Concurrently, the output signal of the digital computer representing the output signal from the analog-to-digital converter is modified to produce a system output signal based on a constant overall gain of the system which is equivalent to the highest available gain from the amplifier. Thus, while the amplifier gain is adjusted by the computer in response to the amplitude of the input signal, the overall system gain is maintained at a level which would be available at the highest amplifier gain. The digital output of the system can subsequently be utilized as a control signal either directly or after a digital-to-analog conversion.

10 Claims, 1 Drawing Figure

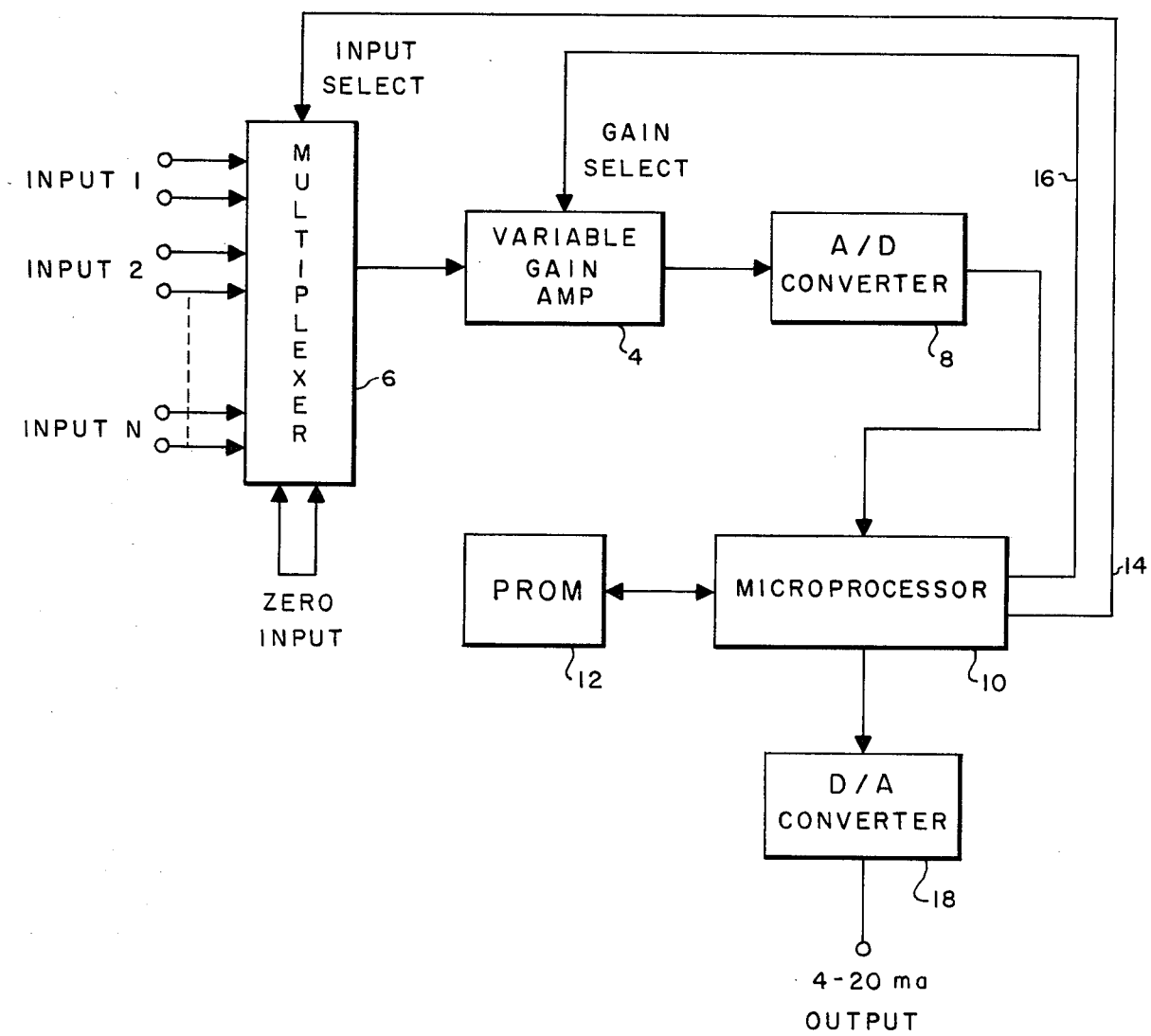

METHOD OF COMPENSATING AN AMPLIFIER SYSTEM HAVING A VARIABLE GAIN AMPLIFIER TO ACHIEVE A CONSTANT OVERALL SYSTEM SIGNAL GAIN AND AN APPARATUS UTILIZING THE SAME

BACKGROUND OF THE INVENTION

1. Field of the Invention

The present invention relates to signal amplifiers. More specifically, the present invention is directed to a signal amplifier system utilizing a method and apparatus for compensating a variable gain amplifier to achieve a constant overall system signal gain.

SUMMARY OF THE INVENTION

An object of the present invention is to provide an improved method and apparatus for compensating a signal amplifier system having a gain amplifier to achieve a constant overall system signal gain.

In accomplishing this and other objects, there has been provided, in accordance with the present invention a method for compensating an amplifier system comprising the steps of applying an input signal to a variable gain analog amplifier means, converting an output of the amplifier means to a digital representation thereof, supplying the digital representation to a digital computer to be used in computing a digital output in accordance with a predetermined system signal gain, and developing a gain selection control signal by the digital computer for selecting a signal gain of the amplifier means to maintain the predetermined system signal gain. A signal amplifier system comprising analog-to-digital converter means for converting an analog input signal into a digital equivalent, said converter having a plurality of selectable signal gains, and a non-volatile memory for storing data on the signal gains of said converter, and digital computer means connected to said converter means and said memory for computing a digital output signal representative of the analog input signal in accordance with a predetermined system signal gain and a control signal for selecting a signal of said converter means to maintain the predetermined system signal gain.

BRIEF DESCRIPTION OF THE DRAWING

A better understanding of the present invention may be had when the following detailed description is read in connection with the accompanying drawing, in which the single FIGURE is a block diagram illustration of an example of an apparatus embodying the method of the present invention.

DESCRIPTION OF THE PREFERRED EMBODIMENT

Detailed Description

Referring to the single FIGURE drawing in more detail, there is shown an example of an apparatus for providing a compensation of a signal amplifier system having a variable gain amplifier 4 utilizing the method of the present invention to achieve a constant overall system signal gain. The variable gain amplifier 4 is supplied with an input from a multiplexer 6 which is arranged to sequentially connect selected ones of a plurality of inputs, input 1, input 2, ... input n to the amplifier 4. Additionally, the multiplexer 6 is also arranged to periodically connect a zero input to the amplifier 4 to provide a means for monitoring the transient noise or offset of the amplifier system. The output of the variable gain amplifier 4 is applied to an analog-to-digital (A/D) converter 8 to be converted to a digital representation thereof. The output of the A/D converter 8 is applied as an input to a digital computer, e.g., microprocessor 10.

A non-volatile memory, e.g., PROM 12, is connected to the microprocessor 10 to store the instructions used by the microprocessor 10 in effecting the method of the present invention. The microprocessor 10 also controls the input selection of the multiplexer 6 via input select line 14 and the gain of the variable gain amplifier 4 via gain select line 16. An output of the microprocessor 10 provides a digital representation of the selected input of the multiplexer 6 after compensation by the microprocessor 10 to effect a constant gain of the signal amplifying system. This microprocessor output is applied to a digital-to-analog (D/A) converter 18 to be converted to a conventional 4-20 mA output signal which can be used to produce a control function, as is well-known in the art, for associated devices (not shown).

Mode of Operation

The method utilized by the present invention basically involves the operation of a two-stage amplifier system which has a constant value of overall signal gain but where the distribution or allocation of the signal gain is dynamically and automatically shifted between the first and second stages as required because of the changing amplitude of the input signal. Thus, this shift of the signal gain produces the best overall performance of the system while maintaining a constant signal gain. In the illustrated embodiment of the invention, the first stage of the amplifier system includes a variable gain analog amplifier 4 having a plurality of signal gain values which can be individually selected since the possible range of the input signal amplitude coupled with the resolution and signal-to-noise requirements of the system are such that no single value of amplifier gain can be realistically used. For example, a high signal gain is desirable for low amplitude input signals while a low signal gain is required for high amplitude input signals to prevent saturation of the amplifier 4.

The second stage of the amplifier system is a digital computer represented by the microprocessor 10. Depending on the value of the output of the A/D converter 8, the computer 10 selects the appropriate gain value of the variable gain amplifier 4. Concurrently, using stored data in the PROM 12 which defines the performance of the analog amplifier 4 at each of the selected gains, an output digital value from the computer 10 is computed which is equivalent to a signal which would have been produced by the variable gain amplifier 4 operating at its highest gain. This digital output signal is then applied to the D/A converter 18 to be converted and used as an input for associated equipment. Thus, the analog amplifier 4 always operates at its optimal gain value with respect to the amplitude of its input signal, and any calculations by the digital computer 10 are simplified since they do not need to be different for each of the analog gains whereby separate calibration curves for each gain are eliminated.

In general, any analog-to-digital conversion method can be defined by a group of equations. Using a specific type of A/D and amplifier combination, the following set of equations can be written to equate digital output of the A/D and amplifier pair to the analog input signal thereto. The equations used by the computer 10 are effective to provide a gain correction for high, medium and low amplitude input signals, e.g., an amplifier 4 and A/D converter pair 8 having three selectable signal gains (G), i.e., high medium and low. Thus, the equations are:

$$GC_H = 0.25 G_H (V_{In} + V_{InOff}) + 0.5 + V_{OutOff}$$

$$GC_M = 0.25 G_M (V_{In} + V_{InOff}) + 0.5 + V_{OutOff}$$

$$GC_L = 0.25 G_L (V_{In} + V_{InOff}) + 0.5 + V_{OutOff}$$

which $V_{InOff}$ and $V_{OutOff}$ are the offset signal levels for the input and output signals from the amplifier 4. True zero input signals ($V_{in} = 0$) can be measured by selecting the zero input which would simplify the above equations to:

$$GC_{ZH} = 0.25 G_H V_{InOff} + 0.5 + V_{OutOff}$$

$$GC_{ZM} = 0.25 G_M V_{InOff} + 0.5 + V_{OutOff}$$

$$GC_{ZL} = 0.25 G_L V_{InOff} + 0.5 + V_{OutOff}$$

Using these equations, the gain is corrected as follows:

$$GC_H - GC_{ZH} = 0.25 G_H V_{In} = GC_{HCorr.} \quad (1)$$

$$GC_M - GC_{ZM} = 0.25 G_M V_{In} = GC_{MCorr.}$$

$$GC_L - GC_{ZL} = 0.25 G_M V_{In} = GC_{LCorr.}$$

Solving for $V_{In}$ in each of these three equations:

$$V_{In} = GC_{HCorr.}/0.25 G_H$$

$$V_{In} = GC_{MCorr.}/0.25 G_M \quad (2)$$

$$V_{In} = GC_{LCorr.}/0.25 G_M \quad (3)$$

and finally substituting equations (2) and (3) for $V_{in}$ in equation (1):

$$GC_{HCorr.} = (G_H/G_M) GC_{MCorr.}$$

$$GC_{HCorr.} = (G_H/G_L) GC_{LCorr.}$$

The ratios $G_H/G_M$ and $G_H/G_L$ are characterized data stored in the PROM 12 during the manufacturing of the system to be used by the digital computer 10 during the system compensation operation. In a typical example, the amplifier 4 would have three selectable gains, e.g., 20, 5 and 1.25.

Initially, when the system is turned on, the gain of the amplifier 4 is initialized to its lowest value. Subsequently, the first input is selected by the multiplexer 6, and the output of the A/D converter 8 is read by the computer 10. Based on the value of that output, the determination is made as to whether or not, the initial amplifier gain in correct. The system can either compensate from the lowest gain level or select the next gain level to improve resolution of the input signal and compensate from the higher gain level. The aforesaid compensation is preferably performed for each input selected by multiplexer 6. Further, the computer 10 can store each selected gain for each input in another memory and, subsequently, selects the prior stored gain when the corresponding input is again selected. Thus, the overall system gain is maintained while the amplifier gain is varied for optimum operation while the division of the system gain is automatically allocated by the computer 10 between the analog and digital stages of the system.

Accordingly, it may be seen that there has been provided, in accordance with the present invention, an improved method of compensating an amplifier system having a variable gain amplifier to achieve a constant overall system signal gain and an apparatus utilizing the same.

The embodiments of the present invention in which an exclusive property or privilege is claimed are defined as follows:

1. A method for compensating an amplifier system comprising the steps of
    applying an input signal to a variable gain analog amplifier means,
    converting an output of the amplifier means representative of an amplified version of the input signal to a digital representation thereof,
    supplying the digital representation to a digital computer to be used in computing a digital output from the digital computer as an output from the amplifier system in accordance with a predetermined overall system signal gain,
    developing a gain selection control signal by the digital computer for selecting a signal gain of the amplifier means to maintain the predetermined overall system signal gain and
    applying the gain selection control signal to the variable gain analog amplifier to select a suitable signal gain of the analog amplifier means.

2. A method as set forth in claim 1 and including the further step of converting the digital output from the digital computer into an analog control signal.

3. A method as set forth in claim 1 and including the further step of storing in a computer memory the desired overall system signal gain and the available signal gains of the amplifier means.

4. A signal amplifier system comprising
    analog-to-digital converter means for converting an analog input signal into a digital equivalent, said converter means having a plurality of selectable signal gains for correspondingly amplifying the analog input signal,
    a non-volatile memory for storing data on the available signal gains of said converter means and on a desired overall signal gain of the amplifier system, and
    digital computer means connected to said converter means and said memory for computing a digital output signal from said amplifier system representative of the analog input signal in accordance with the overall predetermined system signal gain and a control signal for selecting a signal gain of said converter means to maintain the overall predetermined system signal gain.

5. A system as set forth in claim 4 and further including a digital-to-analog converter means for converting the digital output from said computer means into an analog output signal.

6. A system as set forth in claim 5 wherein said analog output signal is a 4-20 mA signal.

7. A system as set forth in claim 4 wherein said converter means has three selectable signal gains.

8. A system as set forth in claim 7 wherein the selectable signal gains are 20, 5 and 1.25.

9. A system as set forth claim 4 and further including an input signal multiplexer for selectively connecting each of a plurality of analog input signal sources to said converter means.

10. A signal amplifier system as set forth in claim 9 wherein said multiplexer is controlled by a second control signal from said digital computer means.

* * * * *